United States Patent [19]
Van Pelt et al.

[11] Patent Number: 5,517,074
[45] Date of Patent: May 14, 1996

[54] PIEZOELECTRIC ACTUATOR DEVICE

[75] Inventors: Engelbert Van Pelt; Wouter Taen, both of Tokyo, Japan

[73] Assignee: U.S. Philips Corporation, New York, N.Y.

[21] Appl. No.: 435,311

[22] Filed: May 5, 1995

[30] Foreign Application Priority Data

Jun. 14, 1994 [JP] Japan .................................... 6-155366

[51] Int. Cl.⁶ .................................................. H01L 41/08
[52] U.S. Cl. .......................................................... 310/328
[58] Field of Search ..................... 310/328, 366

[56] References Cited

U.S. PATENT DOCUMENTS

| | | | |
|---|---|---|---|
| 3,115,588 | 12/1963 | Hueter | 310/8.6 |
| 5,023,503 | 6/1991 | Legge et al. | 310/311 |
| 5,068,567 | 11/1991 | Jones | 310/332 |
| 5,089,739 | 2/1992 | Takahashi et al. | 310/328 |
| 5,262,696 | 11/1993 | Culp | 310/328 |
| 5,278,471 | 1/1994 | Uehara et al. | 310/328 |
| 5,286,199 | 2/1994 | Kipke | 434/114 |
| 5,296,262 | 3/1994 | Didden | 427/125 |
| 5,327,041 | 7/1994 | Culp | 310/328 |
| 5,406,162 | 4/1995 | Hasegawa | 310/328 |

FOREIGN PATENT DOCUMENTS

| | | | |
|---|---|---|---|
| 0535510A1 | 4/1993 | European Pat. Off. | H01L 41/09 |
| 0041272 | 8/1983 | Japan | 310/330 |
| 0077684 | 5/1985 | Japan | 310/328 |
| 0084978 | 5/1985 | Japan | 310/328 |

*Primary Examiner*—Thomas M. Dougherty
*Attorney, Agent, or Firm*—Edward Blocker

[57] ABSTRACT

A piezoelectric actuator, which has a large displacement rate and a relatively simple structure, is capable of providing an output without the need for a specific support and can be manufactured at low costs, is provided. The piezoelectric actuator 10 takes a planar plate-like form and has first and second layer regions 11 and 12 lying one upon the other. The first layer region 11 is formed comprising a piezoelectric ceramic material and contains electrodes 13-1 to 13-n for receiving an actuation voltage to cause this first layer region to contract in a plane parallel thereto. The second layer region 12 is formed integrally with the first layer region 11 and comprises a ceramic material.

6 Claims, 2 Drawing Sheets

5,517,074

PIEZOELECTRIC ACTUATOR DEVICE

FIELD OF THE INVENTION

This invention relates generally to piezoelectric ceramic actuator devices and more particularly to a piezoelectric ceramic actuator device having a specifically designed structure for obtaining a large displacement value.

BACKGROUND OF THE INVENTION

There has been proposed, as a piezoelectric actuator device having a large displacement value, a cantilever-mounted piezoelectric bender which comprises an elongated plate-like piezoelectric actuator member including piezoelectric ceramic layers and electrodes therein. The actuator member is supported at one end thereof by a support, whereby a substantial amount of displacement can be obtained at the free end of the member. See for example U.S. Pat. Nos. 5,023,503 and 5,068,567. This kind of piezoelectric actuator device is disadvantageous, however, in that its application is limited since a support is needed to mount same and in that the force generated is rather small. A piezoelectric actuator device operable without a support is also known which comprises a piezoelectric actuator member to which a metal sheet is bonded so that the displacement of the actuator member is amplified by the metal sheet. However, this type of actuator device is rather complicated in structure and cannot easily be manufactured at low costs.

It is therefore an object of the present invention to provide a piezoelectric actuator device which has a large displacement value.

It is another object of the invention to provide a piezoelectric actuator device which can transmit its output without the need for a dedicated support.

It is a further object of the invention to provide a piezoelectric actuator device which is relatively simple in structure and can therefore be manufactured at lower costs.

SUMMARY OF THE INVENTION

A piezoelectric actuator device according to a first embodiment of the present invention is characterized in that the device is a planar piezoelectric actuator device comprising first and second layer regions lying one upon the other, the first layer region being made of a piezoelectric ceramic material and incorporating therein electrodes for receiving an actuation voltage for radial contraction of the first layer region, the second layer region being made of a ceramic material and formed integrally with the first layer region, wherein said actuator device has a generally square polygonic or circular top view.

With this structure, when an actuation voltage is applied across the electrodes the first layer region radially contracts while the second layer region does not contact, so that the device deforms into a shape of a spherical section. A displacement of the device at the center of the surface of the second layer region between activated and non-activated states of the device is significantly greater than an expansion of the device itself in the direction of width thereof. The above displacement can easily be derived as a mechanical output relative to a reference surface on which the device is placed or held. The above mechanical output is very strong in force and therefore the device can withstand a heavy load.

A piezoelectric actuator device according to a second embodiment of the invention is characterized by comprising:

a first planar piezoelectric actuator element having first and second layer regions disposed one upon the other, the first layer region being made of a piezoelectric ceramic material and incorporating therein electrodes for receiving an actuation voltage for radial contraction of the first layer region, the second layer region being made of a ceramic material and formed integrally with the first layer region;

a second planar piezoelectric actuator element constructed complementarily to the first actuator element; and connecting means for connecting the first and second actuator elements to each other at predetermined locations along peripheries of the first and second actuator elements with the first layer regions of the first and second actuator elements facing each other.

With this structure, a displacement twice as much as that of the first embodiment can be obtained across centers of the surfaces of the second layer regions of the first and second actuator elements.

An actuator unit according to another aspect of the invention is characterized by comprising:

guide means for accommodating a plurality of piezoelectric actuator devices as according the second embodiment in a stacked manner to guide the actuator devices in a direction of width of each device;

stopper means fixedly coupled to the guide means for engaging with an end face of the stack of actuator devices to prevent same from moving in one of the directions of guidance of the actuator devices; and an output member coupled to the guiding means so as to be slidable in the direction of guidance of the actuator devices and having a portion disposed within the guide means for engaging with the other end face of the stack of actuator devices to transmit a movement of the portion in the displacement direction to the exterior of the guide means.

With this actuator unit, a very large displacement determined by the number of actuator devices can be obtained.

DETAILED DESCRIPTION OF THE INVENTION

A piezoelectric ceramic multilayer actuator (hereinafter referred to simply as "CMA") device 10 shown in FIG. 1 takes the form of a plate having a generally square top view and is composed of first and second layer regions 11 and 12 of substantially the same thickness. Although this CMA device is actually very thin as compared to the length and width thereof, its thickness is greatly exaggerated in the figure for a better understanding of the invention.

Figure 1:
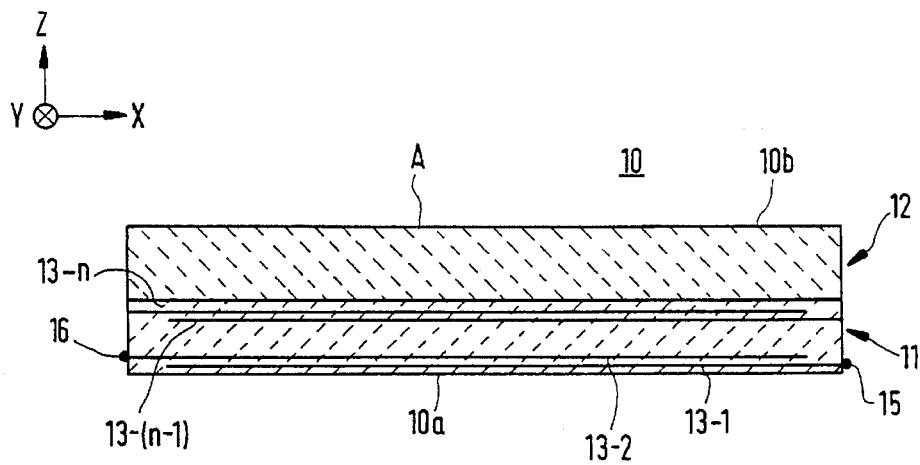
FIG. 1 is a cross-sectional view of piezoelectric ceramic multilayer actuator device according to a first embodiment of the invention.

The first (lower, in this example) layer region 11, which functions as an active layer in this invention, is made of a piezoelectric ceramic material such as barium titanates, lead titanates, lead zirconate titanates and so on and has a multilayer structure in which a number of thin electrodes 13-1 to 13-n are arranged (only four electrodes are illustrated in FIG. 1). These electrodes extend horizontally, i.e., in parallel to the plane of the first layer region 11 and are equally spaced from each other. Each electrode has an area slightly smaller than a horizontal cross-section of the first layer region 11, so that there are no electrodes in the layer region 11 at its peripheral margin. The odd-numbered electrodes 13-1, 13-3, ... 13-(n−1) have extensions reaching one end of the layer region 11 and are electrically connected together at this one end by means of metallization and also to a first contact or terminal 15 which is illustrated only diagrammatically in FIG. 1. Similarly, the even-numbered electrodes 13-2, 13-4, ... 13-n are electrically connected to each other and to a second terminal 16 at the other end of the layer region 11.

The above first layer region 11 is formed, for example, in the following way. First, a paste of the above-described piezoelectric ceramic material is coated on a flat surface with a predetermined thickness and dried to form a first ceramic layer. Then, a metal paste including silver, nickel, aluminium or the like is screen-printed on the above first ceramic layer and dried to form the first electrode 13-1. A paste of the piezoelectric ceramic material is again coated on the first electrode 13-1 and on the marginal exposed part of the aforesaid first ceramic layer and dried to form a second ceramic layer. Thereafter, the latter two steps are repeated until the first layer region 11 including the predetermined number of electrodes 13 is completely formed.

The second (upper, in this example) layer region 12, which functions as a nonactive layer in this invention, has also a multilayer structure and is preferably made of the same piezoelectric ceramic material as the first layer region 11. This second layer region 12 is continuously formed on the first layer region 11, for example, by repeatedly coating a paste of the ceramic material with a predetermined thickness and drying same. However, layer region 12 can also be made of a thick, monolithic layer of ceramic material.

The CMA device 10 thus formed is subjected to a pressing process, a binder-burnout process and a sintering process in a known manner. Subsequently, a polarization is given to the first layer region 11 by known techniques so that a contraction occurs in this layer region in radial directions thereof when an actuation voltage is applied across the terminals 15 and 16.

Figure 2:
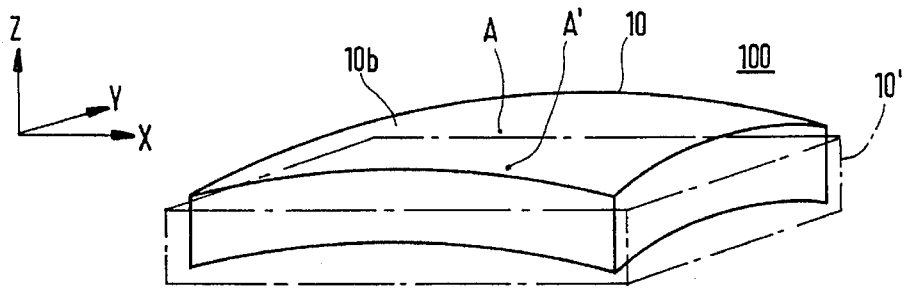
FIG. 2 is a perspective view of the actuator device of FIG. 1 wherein the actuator device is shown in the two different states.

The CMA device 10 having the above structure operates as follows. When an actuation voltage is applied across the terminals 15 and 16, the first layer region 11 contracts in the radial directions of this region, i.e., inwardly in a plane defined by X and Y axes shown in FIG. 1, and expands in the Z direction, while no such contraction nor expansion occurs in the second layer region 12. As a result, the CMA device 10 deforms as a whole to take a partly spherical shape as shown by solid lines in FIG. 2, wherein dot-and-dash lines represent the CMA device 10 in the non-activated state. More specifically, the CMA device 10 deforms in such a way that the non-active second layer region 12 has a convex profile at the surface remote from the active first layer region 11 and that the first layer region 11 has a concave profile at the surface remote from the non-active second layer region 12.

The above CMA device 10, when placed or held on a reference surface with its surface 10a on the side of the first layer region 11 facing thereto, will develop a displacement d at a point A located on the other surface 10b at its center in a direction perpendicular to the reference surface or in the Z direction. This displacement d can be expressed as:

$$d=dD+dZ$$

where dD is a displacement due to the deformation of the CMA device 10 into a spherical section and dZ is a displacement due to the expansion of the CMA 10 device in the Z direction. In an example of the CMA device 10 having a width of 7 mm, a length of 7 mm and a thickness of 0.5 mm, a displacement d of about 15 microns can be obtained as compared to the displacement of dZ of about 0.4 microns. Thus, the displacement d is substantially greater than the displacement dZ.

Although in the above description the ceramic layers in the first and second layer regions 11 and 12 of the above embodiment have been formed by the wet method, i.e., by repeatedly coating a paste of the ceramic material, any other kind of ceramic multilayer technology such as the dray method may alternatively be used for forming these ceramic layers. In the dry method use is made, for example, of so-called green sheets. The second layer region 12 has been formed in the above embodiment with the same piezoelectric material as that used in the first layer region 11. However, the second layer region 12 may alternatively be made of other piezoelectric or non-piezoelectric material if it has physical characteristics similar to those of the material of the region 11. Also, the thickness of the second layer region 12 may not necessarily be the same as that of the first layer region 11. The ratio in thickness of the first layer region 11 to the second layer region 12 may be determined in dependence, for example, on the other necessary displacement and the materials used in the first and second layer regions. Furthermore, the device 10 may not only take a square shape as in the above embodiment but also take any other polygonal shape or a circular shape. Also, the first and second layer regions need not necessarily be of the multilayer structure but may be of a non-multilayer structure. It is also possible to provide a further ceramic layer on the surface of the first layer region remote from the second layer region as a cover layer.

EXAMPLE 1

Eighteen pieces of piezoelectric ceramic multilayer actuator devices similar in construction to the CMA device 10 and each having a width of 7 mm and a length of 7 mm were test-manufactured by the wet method. Each actuator device had three consecutive ceramic layers formed as a cover layer region, nine ceramic layers formed as the active layer region 11 with electrodes interposed therebetween and eleven consecutive ceramic layers formed as the non-active layer region 12, wherein each ceramic layer had a thickness of about 20 microns. The finished ceramic multilayer actuator devices had in average a thickness of about 500 microns. An actuation voltage of 70 volts was applied to each of these actuator devices, whereby an average displacement at the center A of each device of about 15 microns was obtained.

A second embodiment of the present invention will now be described.

Figure 3:
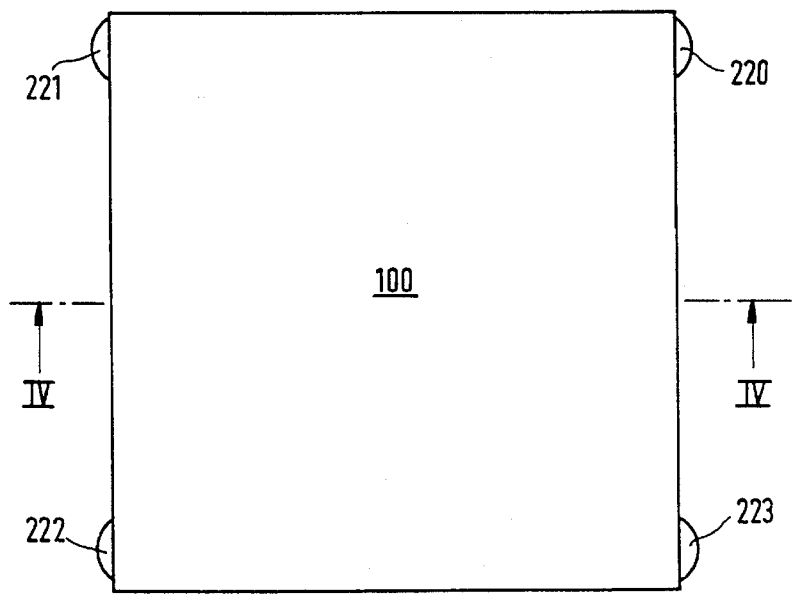
FIG. 3 is a top elevational view of a piezoelectric ceramic multilayer actuator device according to a second embodiment of the invention.
Figure 4:
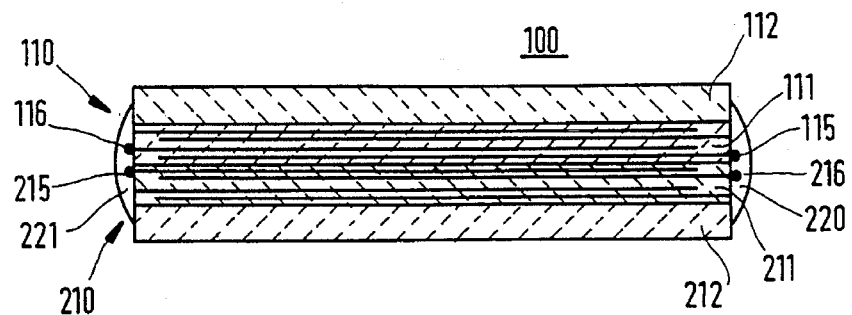
FIG. 4 is a cross-sectional view of the actuator device of FIG. 3 taken along the line IV—IV.

A CMA device 100 shown in FIGS. 3 and 4 comprises a first actuator portion 110 and a second actuator portion 210.

The first actuator portion 110 comprises, similarly to the aforesaid CMA device 10, an active layer region 111 and a non-active layer region 112 which are substantially identical in structure to the first layer region 11 and the second layer region 12 shown in FIG. 1, respectively, and formed integrally with each other. The second actuator portion 210 is constructed complementarily to the above first actuator portion 110 and comprises an active layer region 211 and a non-active layer region 212 which correspond to the active layer region 111 and the non-active layer region 112, respectively. The first and second actuator portions 110 and 210 are joined together at four corners thereof by means of solders 220 to 223 with their surfaces on the sides of the active layer regions 111 and 211 facing each other. For this purpose, side faces of the first and second actuator portions 110 and 210 are metallized in advance at those locations where the soldering is to be made. Each of the active layer regions 111 and 211 contains therein a number of electrodes (only four are illustrated) in a manner described above for the active layer region 11 of the first embodiment. The odd-numbered electrodes in the active layer region 111 are connected to a terminal 115 and the even-numbered electrodes in this region are connected to a terminal 116. Similarly, the odd-numbered electrodes in the active layer region 211 are connected to a terminal 215 and the even-numbered electrodes in this region are connected to a terminal 216. The terminals 115 and 215 are connected together and the terminals 116 and 216 are connected together.

Figure 5:
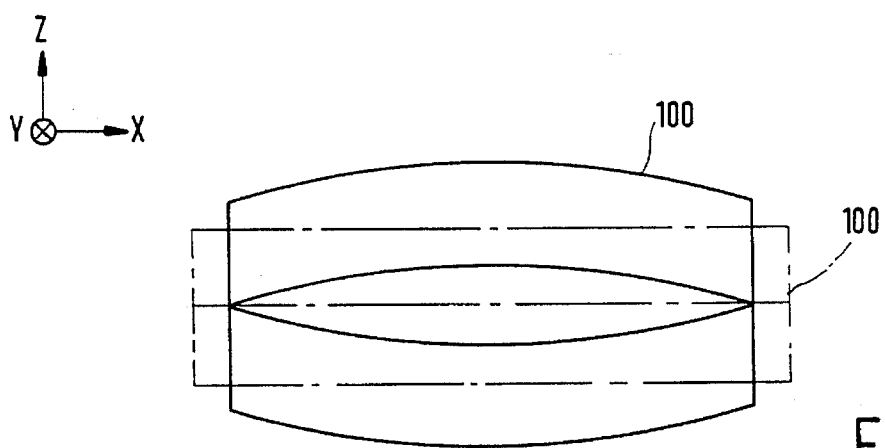
FIG. 5 is a diagrammatic illustration showing a side elevational view of the actuator device of FIG. 3 wherein the actuator device is illustrated in two different states.

When an actuation voltage is applied across the terminals 115 and 116, each of the first and second actuator portions 110 and 210 deforms in a manner described above for the CMA device 10. Since the two actuator portions 110 and 210 are connected together at four corners, the CMA device 100 bulges as a whole as shown by solid lines in FIG. 5, wherein dot-and-dash lines represent the device 100 in the non-activated state. The displacement obtained in this embodiment in the Z direction at the center of the device 100 is therefore twice as much as that obtained in the CMA device 10 if each of the actuator portions 110 and 210 and the CMA device 10 have the same dimensions.

In the above-described second embodiment, each actuator portion may alternatively have any other polygonal shape, a circular shape or a rectangular shape. In the case of a polygonal shape, the two actuator portions are connected together preferably at each corner or in the vicinity of each corner. In the case of a circular shape, the two actuator portions can be connected entirely along their peripheries or at predetermined number of locations equally spaced apart along the peripheries. Furthermore, the two actuator portions can be connected together by other connecting means such as an epoxy resin and other suitable glue.

EXAMPLE 2

Seven pairs were selected from the eighteen piezoelectric ceramic multilayer actuator devices as prepared in EXAMPLE 1. The actuator devices in each pair were connected together by soldering at four corners. An activation voltage of 70 volts was applied to each of the connected actuator devices, whereby an average displacement of 27 microns was obtained.

Figure 6:
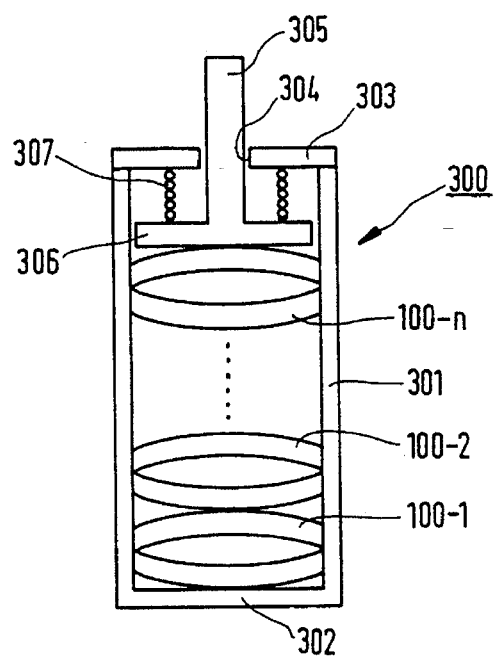
FIG. 6 is a diagrammatic illustration shown an actuator unit in which a plurality of actuator devices of FIG. 3 are used.

FIG. 6 shows an actuator unit 300 capable of providing a linear large-stroke output by the use of a plurality of CMA devices according to the above embodiment.

In FIG. 6, a plurality of CMA devices 100-1 to 100-N are stacked in a metal tube 301 with a bottom 302, which tube has a cross-section corresponding to the shape or the top view of each device 100. The tube 301 is closed at its top with a cap 303 which has a central aperture 304 through which a rod 305 of a piston 306 is passed. The rod 305 serves as an output member or a push rod of this actuator unit. A spring 307 is provided between the cap 303 and the piston 306 to urge the piston 306 downwardly, i.e., against the stack of the CMA devices 100. A suitable means (not shown in FIG. 6) for supplying an activation voltage to all the stacked CMA devices 100 is provided in this unit.

When no activation voltage is applied, all the stacked CMA devices 100 are flat, so that the rod 305 is in the lower-most position. When an activation voltage is applied to this unit 300, all the devices 100 bulge in accordance with the value of the applied voltage, whereby the piston 306 hence the rod 305 is pushed up. This displacement of the rod 305 is N times larger than in the case of a single CMA device 100.

We claim:

1. A piezoelectric actuator device comprising:

a first planar piezoelectric actuator element having first and second layer regions disposed one upon the other, said first layer region being active and made of a piezoelectric ceramic material and incorporating therein electrodes for receiving an actuation voltage that radially contracts said first layer region, said second layer region being non-active and made of a ceramic material and being formed integrally with said first layer region so as to cause spherical bending of said first actuator element when said first layer region radially contracts;

a second planar piezoelectric actuator element constructed complementarily to said first actuator element; and connecting means for mechanically connecting said first and second actuator elements to each other only at predetermined locations along peripheries of said first and second actuator elements with the first layer regions of said first and second actuator elements facing each other so that said first and second actuator elements spherically bend in opposite directions in order to produce a change in overall thickness dimension of said mechanically connected first and second actuator elements upon contraction of the first layer regions of said first and second actuator elements that is greater than any combined change in thickness of said first layer regions of said first and second actuator elements.

2. A piezoelectric actuator device according to claim 1, wherein each of the first and second actuator elements has a generally square top view and wherein said connecting means are solders connecting said first and second actuator elements at four corners or in the vicinity of the four corners thereof.

3. A piezoelectric actuator device according to claim 1, wherein said first and second layer regions of each actuator element are made of the same piezoelectric ceramic material.

4. A piezoelectric actuator device according to claim 1, both of said first and second layer regions of each actuator element are formed by means of a ceramic multilayer technology.

5. A piezoelectric actuator device comprising:

a first planar piezoelectric actuator element having first and second layer regions disposed one upon the other, said first layer region being made of a piezoelectric ceramic material and incorporating therein electrodes for receiving an actuation voltage for radial contraction of said first layer region, Said second layer region being made of a ceramic material and formed integrally with said first layer region;

a second planar piezoelectric actuator element constructed complementarily to said first actuator element; and connecting means for connecting said first and second actuator elements to each other at predetermined locations along peripheries of said first and second actuator elements with the first layer regions of said first and second actuator elements facing each other, wherein each of the first and second actuator elements has a circular top view and wherein said connecting means are solders connecting said first and second actuator elements entirely along peripheries thereof.

6. An actuator unit comprising:

a plurality of piezoelectric actuator devices, each said actuator device comprising:

a first planar piezoelectric actuator element having first and second layer regions disposed one upon the other, said first layer region being made of a piezoelectric ceramic material and incorporating therein electrodes for receiving an actuation voltage for radial contraction of said first layer region, said second layer region being made of a ceramic material and formed integrally with said first layer region;

a second planar piezoelectric actuator element constructed complementarily to said first actuator element; and connecting means for connecting said first and second actuator elements to each other at predetermined locations along peripheries of said first and second actuator elements with the first layer regions of said first and second actuator elements facing each other;

guide means for accommodating said plurality of piezoelectric actuator devices in a stacked manner to guide said actuator devices in a direction of width of each device;

stopper means fixedly coupled to said guide means for engaging with an end face of the stack of actuator devices to prevent same from moving towards said stopper means; and an output member coupled to said guiding means so as to be slidable in the direction of displacement of said actuator devices and having a portion disposed within said guide means for engaging with the other end face of said stack of actuator devices to transmit a movement of said portion in said displacement direction to the exterior of said guide means.

* * * * *